(12) United States Patent
Gower et al.

(10) Patent No.: US 7,363,533 B2
(45) Date of Patent: Apr. 22, 2008

(54) HIGH RELIABILITY MEMORY MODULE WITH A FAULT TOLERANT ADDRESS AND COMMAND BUS

(75) Inventors: Kevin C. Gower, Lagrangeville, NY (US); Bruce Hazelzet, Essex Junction, VT (US); Mark W. Kellogg, Poughkeepsie, NY (US); David J. Perlman, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 211 days.

(21) Appl. No.: 11/406,717

(22) Filed: Apr. 20, 2006

(65) Prior Publication Data

US 2006/0190780 A1    Aug. 24, 2006

Related U.S. Application Data

(62) Division of application No. 10/413,605, filed on Apr. 14, 2003, now Pat. No. 7,234,099.

(51) Int. Cl.
 *G06F 11/10* (2006.01)
(52) U.S. Cl. .............................. 714/6; 714/53; 714/56
(58) Field of Classification Search .................. 714/6, 714/53, 56, 768
See application file for complete search history.

(56) References Cited

U.S. PATENT DOCUMENTS

| | | | | |
|---|---|---|---|---|
| 3,798,606 A | * | 3/1974 | Henle et al. ................ 714/797 |
| 4,245,344 A | * | 1/1981 | Richter ........................ 714/43 |
| 4,438,494 A | * | 3/1984 | Budde et al. .................... 714/2 |
| 4,672,609 A | * | 6/1987 | Humphrey et al. ........ 714/719 |
| 4,870,704 A | * | 9/1989 | Matelan et al. ............. 710/120 |
| 5,164,944 A | | 11/1992 | Benton et al. |
| 5,173,905 A | * | 12/1992 | Parkinson et al. .......... 714/768 |
| 5,272,664 A | | 12/1993 | Alexander et al. |
| 5,513,135 A | | 4/1996 | Dell et al. |

(Continued)

FOREIGN PATENT DOCUMENTS

TW        526498 B       4/2003

OTHER PUBLICATIONS

StorFacts Reports, [online]; [retrieved from the Internet]; Memory Analysis, GST, Inc. https:www.gstinc.com/products/info/ibm-memory/i5.pdf, no date.

(Continued)

*Primary Examiner*—Stephen M. Baker
(74) *Attorney, Agent, or Firm*—Lynn L. Augspurger

(57) ABSTRACT

A high reliability dual inline memory module with a fault tolerant address and command bus for use in a server. The memory module is a card provided with a plurality of contacts of which some are redundant, a plurality of DRAMs, a phase lock loop, a 2 or 32K bit serial EE PROM, and a 28 bit 1 to 2 register having error correction code (ECC), parity checking, a multi-byte fault reporting circuitry for reading via an independent bus, and real time error lines for determining and reporting both correctable errors and uncorrectable error conditions coupled to the server's memory interface chip and memory controller or processor such that the memory controller sends address and command information to the register via address/command lines together with check bits for error correction purposes to the ECC/Parity register.

19 Claims, 11 Drawing Sheets

U.S. PATENT DOCUMENTS

| | | | |
|---|---|---|---|
| 5,535,342 A | 7/1996 | Taylor | |
| 5,546,410 A | 8/1996 | Ando et al. | |
| 5,768,294 A * | 6/1998 | Chen et al. | 714/766 |
| 5,841,795 A * | 11/1998 | Olarig et al. | 714/768 |
| 5,923,682 A | 7/1999 | Seyyedy | |
| 6,018,817 A | 1/2000 | Chen et al. | |
| 6,049,476 A | 4/2000 | Laudon et al. | |
| 6,052,818 A | 4/2000 | Dell et al. | |
| 6,070,255 A | 5/2000 | Dell et al. | |
| 6,097,883 A | 8/2000 | Dell et al. | |
| 6,222,739 B1 | 4/2001 | Bhakta et al. | |
| 6,272,609 B1 * | 8/2001 | Jeddeloh | 711/169 |
| 6,282,210 B1 | 8/2001 | Rapport et al. | |
| 6,379,193 B1 | 4/2002 | Fujii et al. | |
| 6,411,517 B1 | 6/2002 | Babin | |
| 6,502,161 B1 | 12/2002 | Perego et al. | |
| 6,520,805 B2 | 2/2003 | Hassanzadeh et al. | |
| 6,535,411 B2 | 3/2003 | Jolin et al. | |
| 6,629,855 B1 | 10/2003 | North et al. | |
| 6,711,666 B1 | 3/2004 | Feldman | |
| 6,711,695 B1 | 3/2004 | Burns et al. | |
| 6,725,414 B2 | 4/2004 | Seyyedy | |
| 6,754,858 B2 * | 6/2004 | Borkenhagen et al. | 714/720 |
| 6,756,661 B2 | 6/2004 | Tsuneda et al. | |
| 2002/0006032 A1 | 1/2002 | Karabatsos | |
| 2002/0019170 A1 | 2/2002 | Hassanzadeh et al. | |
| 2002/0121920 A1 | 9/2002 | Jolin et al. | |
| 2002/0133684 A1 | 9/2002 | Anderson | |
| 2003/0090879 A1 | 5/2003 | Doblar et al. | |
| 2003/0126356 A1 | 7/2003 | Gustavson et al. | |

OTHER PUBLICATIONS

Arroyo, et al.; IBM Research Disclosure V42M424; "On Part Memory; DIMM Error Logging"; Article 424100; Aug. 3, 1999.

* cited by examiner

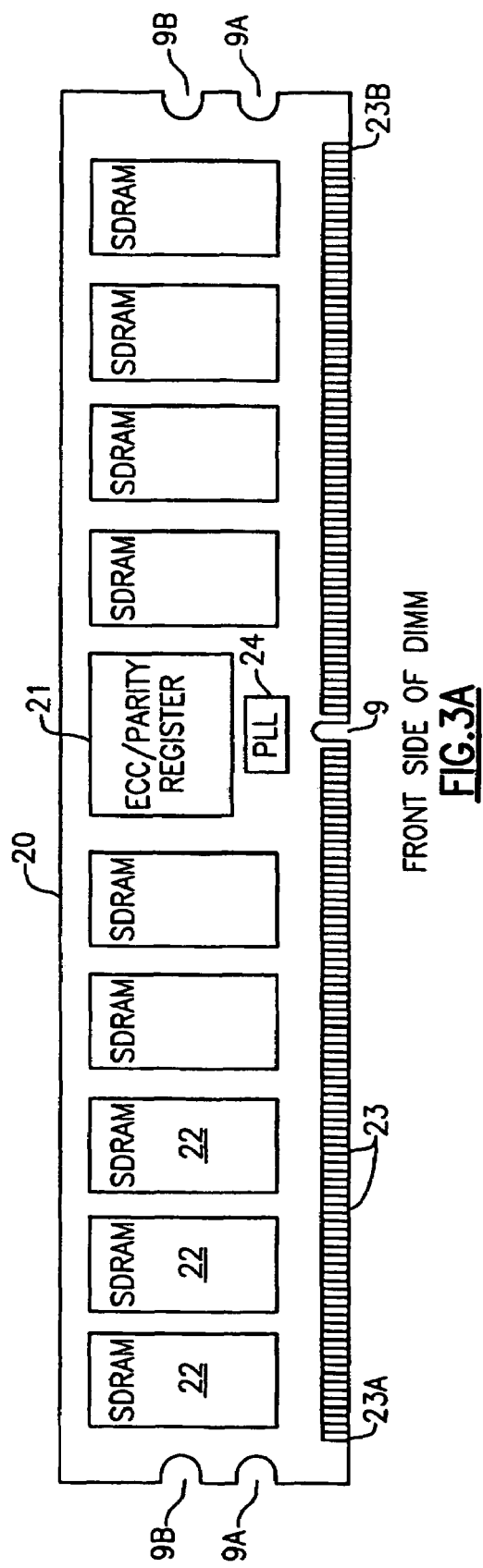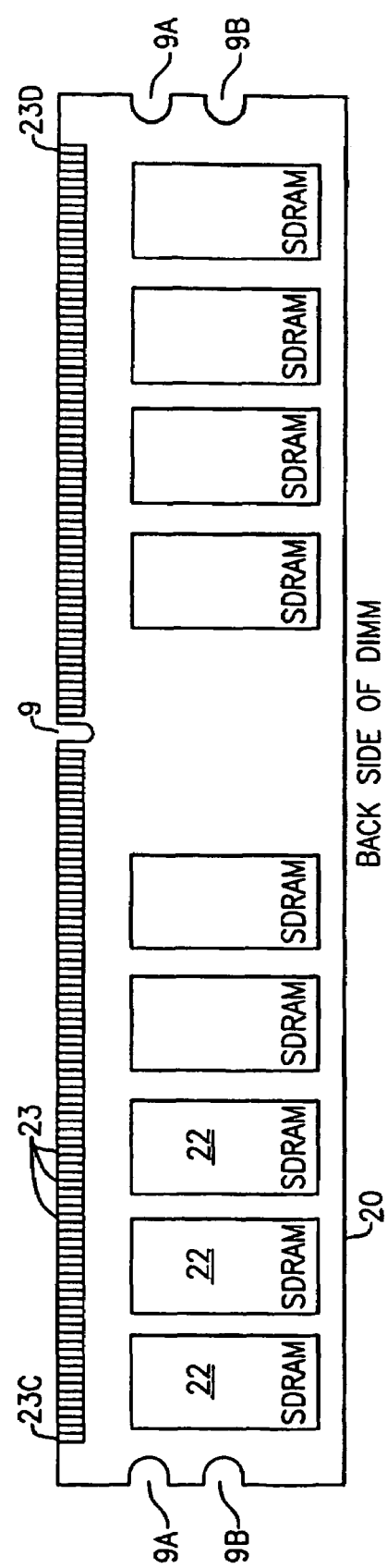

|    | D0 | D1 | D2 | D3 | D4 | D5 | D6 | D7 | D8 | D9 | D10 | D11 | D12 | D13 | D14 | D15 | D16 | D17 | D18 | D19 | D20 | D21 | C0 | C1 | C2 | C3 | C4 | C5 |
|----|----|----|----|----|----|----|----|----|----|----|-----|-----|-----|-----|-----|-----|-----|-----|-----|-----|-----|-----|----|----|----|----|----|----|
| S0 | 1  | 1  | 1  | 0  | 0  | 1  | 1  | 0  | 1  | 0  | 0   | 0   | 0   | 0   | 1   | 0   | 0   | 1   | 0   | 1   | 0   | 1   | 1  | 0  | 0  | 0  | 0  | 0  |
| S1 | 0  | 1  | 1  | 1  | 0  | 0  | 1  | 1  | 0  | 1  | 1   | 0   | 0   | 0   | 1   | 1   | 1   | 0   | 1   | 0   | 1   | 0   | 0  | 1  | 0  | 0  | 0  | 0  |
| S2 | 0  | 0  | 1  | 1  | 1  | 1  | 0  | 1  | 1  | 0  | 0   | 1   | 0   | 0   | 0   | 0   | 1   | 0   | 0   | 1   | 1   | 1   | 0  | 0  | 1  | 0  | 0  | 0  |
| S3 | 1  | 0  | 0  | 1  | 1  | 0  | 1  | 0  | 0  | 1  | 1   | 1   | 1   | 1   | 0   | 1   | 0   | 1   | 1   | 0   | 1   | 1   | 0  | 0  | 0  | 1  | 0  | 0  |
| S4 | 1  | 0  | 0  | 0  | 0  | 0  | 0  | 1  | 0  | 0  | 0   | 1   | 1   | 1   | 1   | 1   | 1   | 1   | 1   | 0   | 1   | 1   | 0  | 0  | 0  | 0  | 1  | 0  |
| S5 | 0  | 0  | 0  | 0  | 0  | 0  | 0  | 0  | 0  | 0  | 1   | 1   | 1   | 1   | 1   | 1   | 1   | 1   | 1   | 1   | 1   | 1   | 0  | 0  | 0  | 0  | 0  | 1  |

FIG.6

| SERVER DIMM | | SERVER DIMM | |
|---|---|---|---|
| PIN NUMBER | PIN NAME | PIN NUMBER | PIN NAME |
| 1 | Vref | 139 | Vref |
| 2 | SCL | 140 | SCL |
| 3 | SDA | 141 | SDA |
| 4 | UE | 142 | UE |
| 5 | CE | 143 | CE |
| 6 | VDD | 144 | VDD |
| 7 | ECCMODE | 145 | ECCMODE |
| 8 | DLY CKE/ODT | 146 | DLY CKE/ODT |
| 9 | CS GATE EN | 147 | CS GATE EN |
| 10 | GND | 148 | GND |
| 11 | DQ0 | 149 | DQ4 |
| 12 | DQ1 | 150 | DQ5 |
| 13 | GND | 151 | GND |
| 14 | DQS0* | 152 | DQS9 |
| 15 | DQS0 | 153 | DQS9* |
| 16 | GND | 154 | GND |
| 17 | DQ2 | 155 | DQ6 |
| 18 | DQ3 | 156 | DQ7 |
| 19 | GND | 157 | GND |
| 20 | VDD | 158 | VDD |
| 21 | GND | 159 | GND |
| 22 | DQ8 | 160 | DQ12 |
| 23 | DQ9 | 161 | DQ13 |
| 24 | GND | 162 | GND |
| 25 | DQS1* | 163 | DQS10 |
| 26 | DQS1 | 164 | DQS10* |
| 27 | GND | 165 | GND |
| 28 | DQ10 | 166 | DQ14 |
| 29 | DQ11 | 167 | DQ15 |
| 30 | GND | 168 | GND |
| 31 | DQ16 | 169 | DQ20 |
| 32 | DQ17 | 170 | DQ21 |
| 33 | GND | 171 | GND |
| 34 | DQS2* | 172 | DQS11 |
| 35 | DQS2 | 173 | DQS11* |
| 36 | GND | 174 | GND |
| 37 | DQ18 | 175 | DQ22 |
| 38 | DQ19 | 176 | DQ23 |
| 39 | GND | 177 | GND |
| 40 | RESET | 178 | RESET |
| 41 | VDD | 179 | VDD |
| 42 | GND | 180 | GND |
| 43 | DQ24 | 181 | DQ28 |
| 44 | DQ25 | 182 | DQ29 |
| 45 | GND | 183 | GND |
| 46 | DQS3* | 184 | DQS12 |
| 47 | DQS3 | 185 | DQS12* |
| 48 | GND | 186 | GND |
| 49 | DQ26 | 187 | DQ30 |
| 50 | DQ27 | 188 | DQ31 |
| 51 | GND | 189 | GND |
| 52 | CB0 | 190 | CB4 |

FIG.7A

```
53  CB1              191  CB5
54  GND              192  GND
55  DQS8*            193  DQS17
56  DQS8             194  DQS17*
57  GND              195  GND
58  CB2              196  CB6
59  CB3              197  CB7
60  GND              198  GND
61  VDD              199  VDD
62  CKE1             200  CKE1
63  CHKBT4           201  CHKBT1
64  CHKBT5           202  CHKBT3
65  CKE0             203  CKE0
66  VDD              204  VDD
67  A15              205  A14
68  BA2              206  A12
69  CHKBT0/PTY       207  A9
70  A11              208  CHKBT2
71  VDD              209  VDD
72  A7               210  A8
73  A5               211  A6
74  A4               212  A3
75  A2               213  A1
76  VDD              214  VDD
77  CK0              215  CK0
78  CK0B             216  CK0B
79  VDD              217  VDD
80  GND              218  GND
81  VDD              219  VDD
82  A10              220  A0
83  BA0              221  BA1
84  WE               222  RAS
85  VDD              223  VDD
86  CS0              224  CS0
87  CAS              225  NC
88  ODT0             226  ODT0
89  NC               227  A13
90  VDD              228  VDD
91  CS1              229  CS1
92  ODT1             230  ODT1
93  NC               231  TEST/NC
94  VDD              232  VDD
95  GND              233  GND
96  DQ32             234  DQ36
97  DQ33             235  DQ37
98  GND              236  GND
99  DQS4*            237  DQS13
100 DQS4             238  DQS13*
101 GND              239  GND
102 DQ34             240  DQ38
```

FIG. 7B

| | | | |
|---|---|---|---|
| 103 | DQ35 | 241 | DQ39 |
| 104 | GND | 242 | GND |
| 105 | DQ40 | 243 | DQ44 |
| 106 | DQ41 | 244 | DQ45 |
| 107 | GND | 245 | GND |
| 108 | DQS5* | 246 | DQS14 |
| 109 | DQS5 | 247 | DQS14* |
| 110 | GND | 248 | GND |
| 111 | DQ42 | 249 | DQ46 |
| 112 | DQ43 | 250 | DQ47 |
| 113 | GND | 251 | GND |
| 114 | DQ48 | 252 | DQ52 |
| 115 | DQ49 | 253 | DQ53 |
| 116 | GND | 254 | GND |
| 117 | DQS6* | 255 | DQS15 |
| 118 | DQS6 | 256 | DQS15* |
| 119 | GND | 257 | GND |
| 120 | DQ50 | 258 | DQ54 |
| 121 | DQ51 | 259 | DQ55 |
| 122 | GND | 260 | GND |
| 123 | DQ56 | 261 | DQ60 |
| 124 | DQ57 | 262 | DQ61 |
| 125 | GND | 263 | GND |
| 126 | DQS7* | 264 | DQS16 |
| 127 | DQS7 | 265 | DQS16* |
| 128 | GND | 266 | GND |
| 129 | DQ58 | 267 | DQ62 |
| 130 | DQ59 | 268 | DQ63 |
| 131 | GND | 269 | GND |
| 132 | VDD | 270 | VDD |
| 133 | SA2 | 271 | SA2 |
| 134 | VDDSPD | 272 | VDDSPD |
| 135 | SDA | 273 | SDA |
| 136 | SCL | 274 | SCL |
| 137 | SA0 | 275 | SA0 |
| 138 | SA1 | 276 | SA1 |

FIG.7C

HIGH RELIABILITY MEMORY MODULE WITH A FAULT TOLERANT ADDRESS AND COMMAND BUS

CROSS-REFERENCE TO RELATED APPLICATIONS

This application is a divisional application of U.S. patent application Ser. No. 10/413,605, filed Apr. 14, 2003 now U.S. Pat. No. 7,234,099, the contents of which are incorporated by reference herein in their entirety.

FIELD OF THE INVENTION

This invention relates generally a high-reliability memory module with a fault tolerant address and command bus for use as a main memory that will achieve the degree of fault-tolerance and self-healing necessary for autonomic computing systems.

BACKGROUND OF THE INVENTION

Memory modules are well known to the prior art and have been and are presently being used in practical applications such as in computers and other equipment using solid state memories.

Broadly speaking, currently available main memories offer bandwidths in the range of 1.6 to 2.6 GB/s, and although some memories provide for limited data path error correction most offer no means of any error correction. Furthermore, memory modules for server products usually include redrive logic for address and command inputs, and clock re-synchronization and redrive circuitry to ensure accurate clock timings at each device on the memory assembly. Although these solutions provide systems with the ability to achieve the specified bandwidth objectives, the overall quantity and types of failures in the memory subsystem, outside the data path itself, has actually increased due to the added circuitry associated with each memory device. Simultaneously, as servers are more widely utilized in business, many server applications simply cannot accept periodic unplanned system outages caused by failed memory modules. Thus the emphasis and need of improved overall system reliability is increasing dramatically and requires a comprehensive system solution that includes both a high degree of fault tolerance and overall reliability.

The present invention provides such a comprehensive system solution that includes the high degree of fault tolerance and the overall differentiated system reliability long desired in the server market.

Other possible solutions, such as memory mirroring, symbol slicing and extensive forms of fault rejection and redundancy, provide enhanced memory subsystem reliability, but, due to negative impacts such as increased cost, power, and reduced performance, have been considered only for niche applications where price is not of high importance as these subsystem quality enhancements are very expensive to implement. Therefore solutions suitable for the low or midrange server markets have not been available.

Consequently the industry has long sought a simple, relatively inexpensive and reliable solution that provides differentiated product quality, that provides an adequate level of asset-protection that does not endanger the reliability of the system through the use of reduced-function memory assemblies and yet is cost competitive.

SUMMARY OF THE PRESENT INVENTION

The present invention is directed to a high reliability memory controller/interface module, provided with a high degree of compatibility with industry-standard solutions, capable of meeting the desired performance and reliability requirements and interfacing with the presently available memory modules, as well as with existing or enhanced support devices. The present invention accomplishes all these ends, resulting in an enhanced reliability memory solution at low cost.

An object of the present invention is a 28 bit 1:2 register, intended for use with Dual Inline Memory Modules (DIMMs) having Dynamic Random Access Memory chips thereon. The register of the present invention has added thereto error correction code (ECC) logic to correct single bit errors on the command or address bus, and permit continuous memory operation independent of the existence of these errors.

Another object of the present invention is to include in such DIMMs error latches and an error reporting mode whereby the system may interrogate the device to determine the error condition thereby allowing accurate fault determination and preventive maintenance—thereby reducing unplanned system outages.

A further object of the present invention is to include redundant contacts on all connectors/DIMM interconnects that would otherwise be considered single points of failure whereby an intermittent or permanent contact failure would result in an unplanned system outage.

Still another object of the present invention is to provide the DIMM with key operational features such as chip select gating of key inputs and programmable delay for un-gated inputs, thereby reducing module power and offering increased operational flexibility.

A further object of the invention is to provide a DIMM that can be readily utilized in presently available controllers in a manner most applicable to the market needs.

Another further object of the present invention is to have a DIMM that uses connectors similar to those presently in use so that prior art contacts, molds, handlers and related production tools can continue to be used such that the modules can be more cheaply produced with additional density while providing value-added reliability, and other value-add attributes, such as a higher memory packaging density with minimal additional production costs.

The DIMM of the present invention is comprised of a printed circuit board having a front side and a back side and a plurality of dynamic random access memories (DRAMs) or synchronous dynamic random access memories (SDRAMs) affixed to both the front surface and the back surface. On a first edge of the front surface of said board there is provided one hundred and thirty eight (138) contacts for connecting circuitry, external to the card, to the SDRAMS and related devices on the DIMM and on the same first edge on the rear side of the card there is provided an additional one hundred and thirty eight (138) external circuitry connecting contacts so that the board has a total of two hundred and seventy six (276) external circuitry connecting contacts thereon. The contact means provided on the front and the back sides of the printed circuit card provide for electrically connecting the external circuitry to the SDRAMs in a direct or indirect manner.

Still another further object of the present invention is to provide a server memory structure having a dual inline memory module or DIMM provided with selective redundant contacts, a phase lock loop, 2 or 32K bit serial electronically erasable programmable read only memory (EEPROM) and a 28 bit, 1 to 2 register having error correction code (ECC), parity checking, a multi-byte fault reporting register, read via an independent bus, and real time error lines for both correctable errors and uncorrectable error conditions. More particularly the server of the present invention comprises a novel DIMM provided with a new and unique ECC/Parity Register coupled to the memory interface chip 18 which is in turn coupled to the Memory controller or processor 19 such that the memory controller sends address and command information to the register via address/command lines together with check bits for error correction purposes to the ECC/Parity register.

Still another object of the invention is to provide for detecting if the module installed in the server can monitor the address and control bus integrity, correct errors on the address and control bus, report errors and log and counts errors.

Still an other object of the invention is to provide for Parity error reporting in which the parity signal is delivered one cycle after the address and command to which it applies, and the error line be driven low two clocks after the address and command bits are driven to the DRAMs from the register on the DIMM. After holding the error line low for only 2 clock cycles, the driver can be disabled and the output permitted to return to an undriven state (high impedance) thus allowing this line to be shared by multiple modules.

Still further the invention provides means for and a method for adjusting the propagation delay, for signals on the memory module that are not included in the ECC circuitry, such that the signals can be selectively re-driven within one or two clock cycles.

Still further the present invention permits operation of the memory module in parity mode, such that unused ECC check bit inputs are held at a low level thus ensuring that these inputs are at a known and quiescent state.

Still further the present invention provides for reducing the probability of Single Point of Failures occurring by providing selected signals with redundant contacts directly on the opposite side of the DIMM from the original function contact thereby reducing the probability of a contact failure resulting in an unplanned system outage.

Even further the present invention provides for operating a module of the present invention consistent with conventional non-ECC protected modules, by removing the secondary registers (post-ECC) from the delay path by setting the /ECC Mode control pin to a high level.

These objects, features and advantages of the present invention will be become further apparent to those skilled in the art from the following detailed description taken in conjunction with the accompanying drawings wherein:

BRIEF DESCRIPTION OF THE DRAWINGS

FIGS. 3A and 3B are plan views respectively of the front and back of the two hundred and seventy six (276) pin dual inline memory module (DIM) of the present invention;

FIG. 6 describes, in H—matrix form, the preferred ECC code selected for the module of FIG. 3;

FIGS. 7A, 7B and 7C show the designated contacts or pin connections for the DIMM of FIGS. 3A and 3B.

DESCRIPTION OF THE PREFERRED EMBODIMENT

Figure 1:
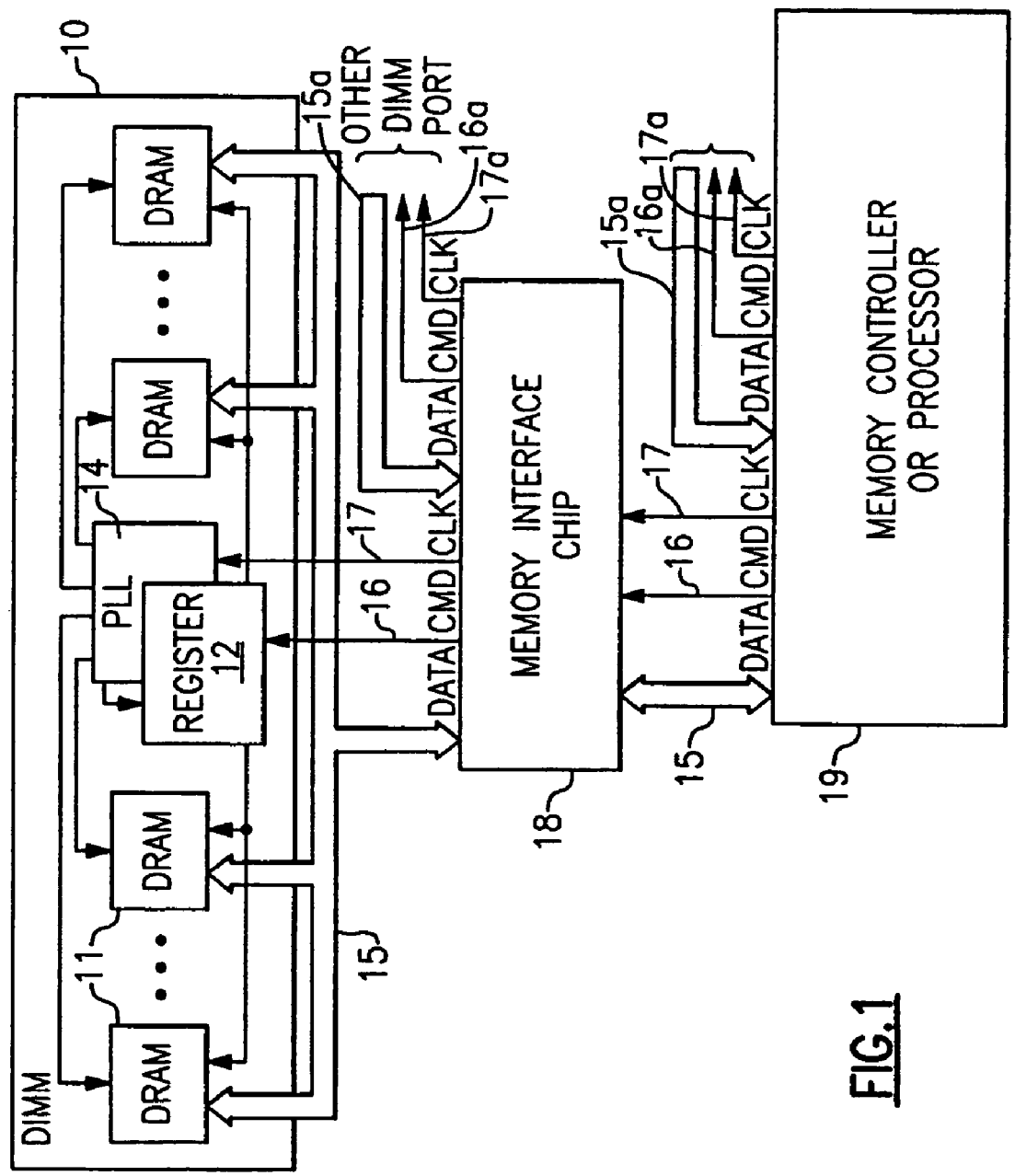
FIG. 1 is a block diagram of a typical server memory arrangement.
Figure 2:
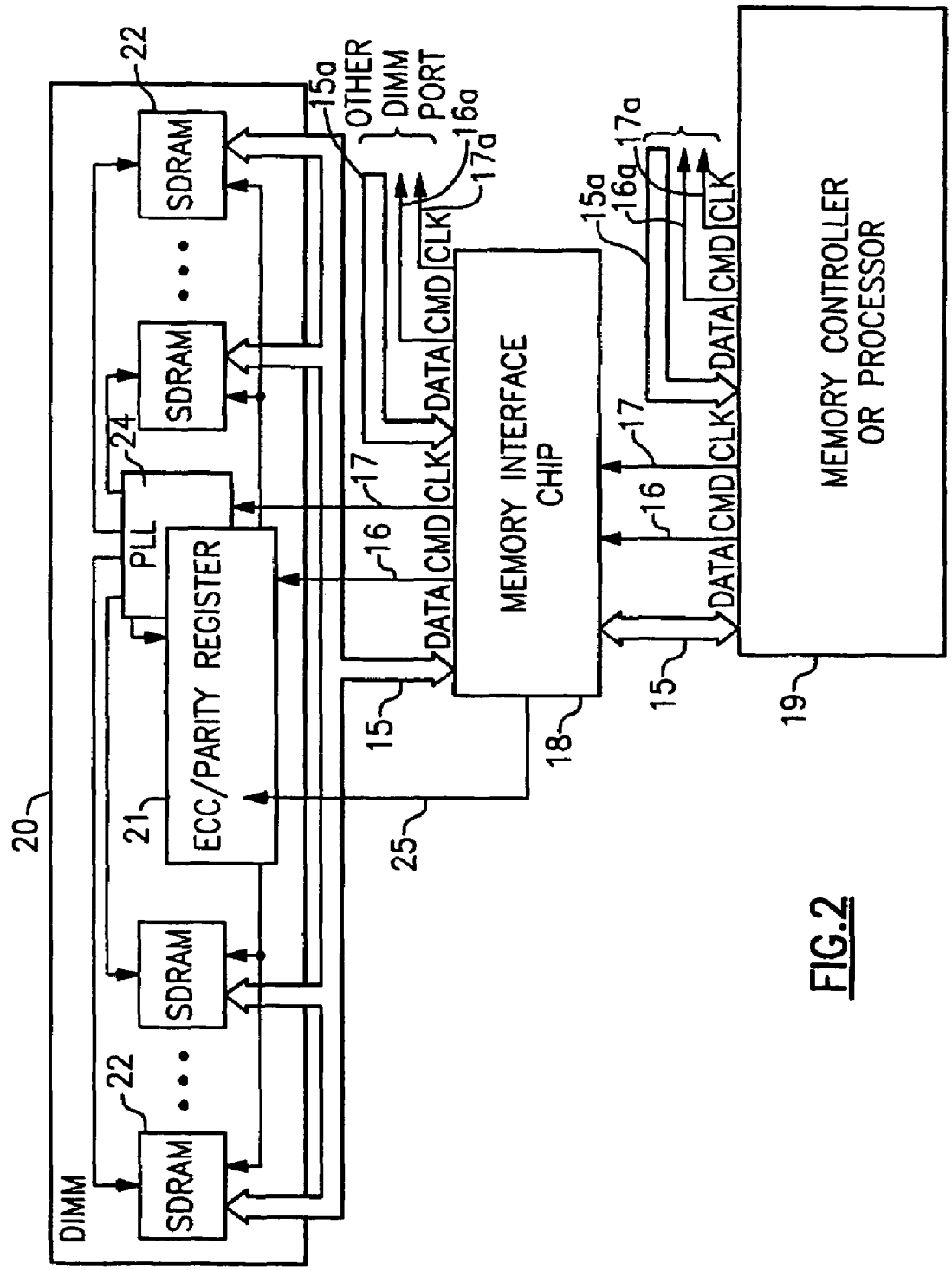
FIG. 2 is a block diagram of the enhanced server memory arrangement of the present invention.
Figure 4A:
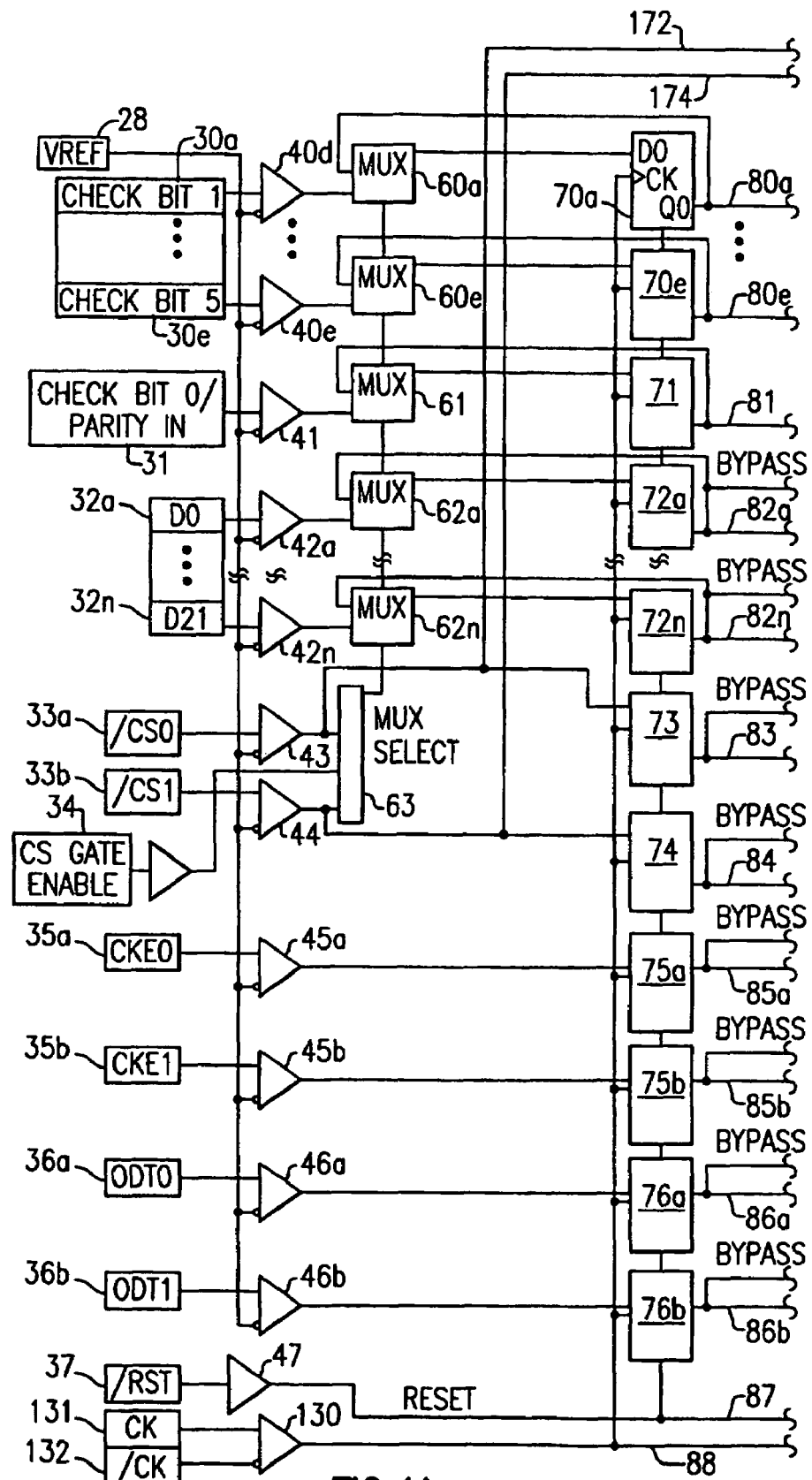
FIGS. 4A and 4B are schematic views of the ECC/Parity register, shown in FIG. 3A.
Figure 4B:
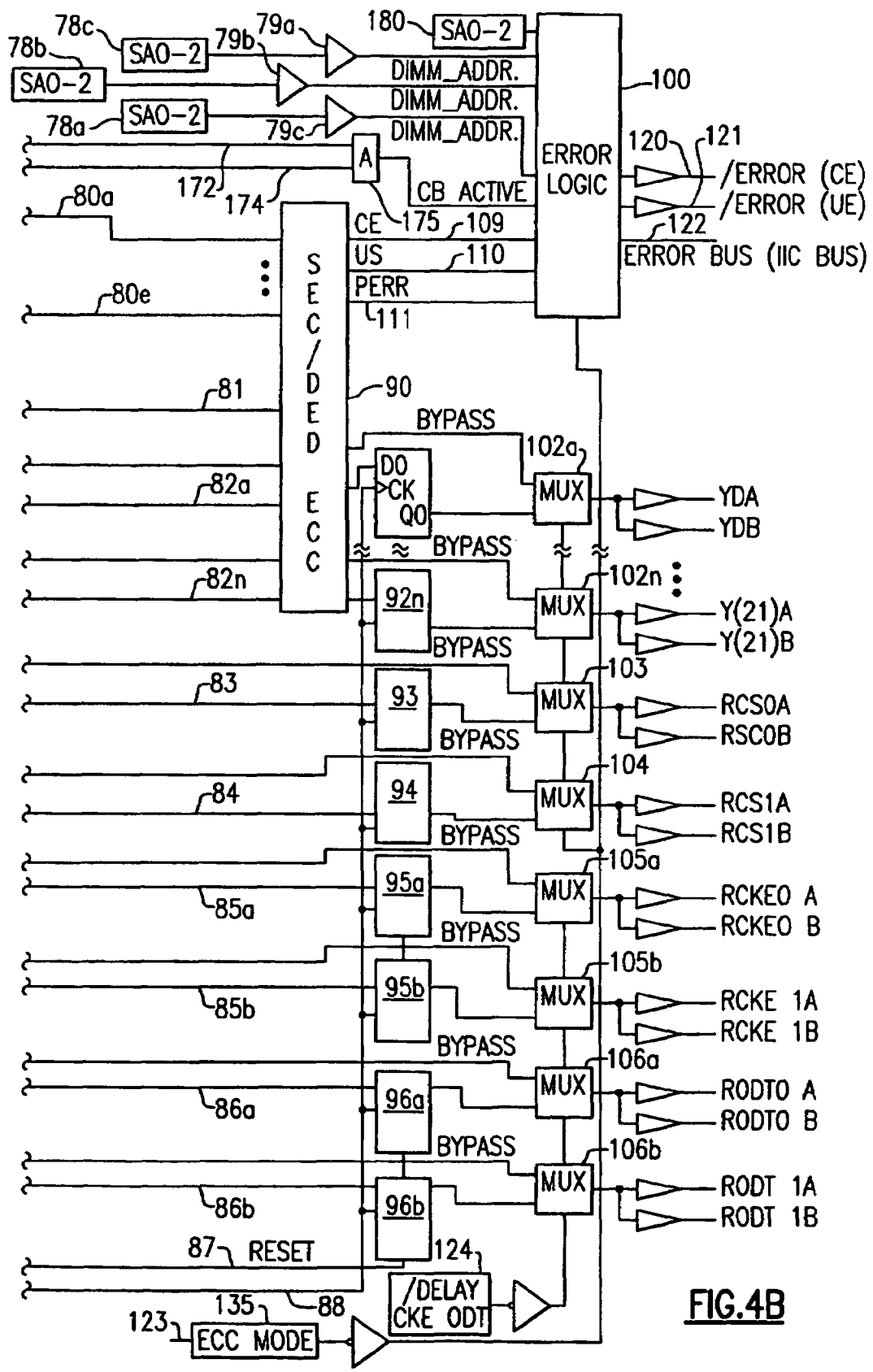
Figure 5:
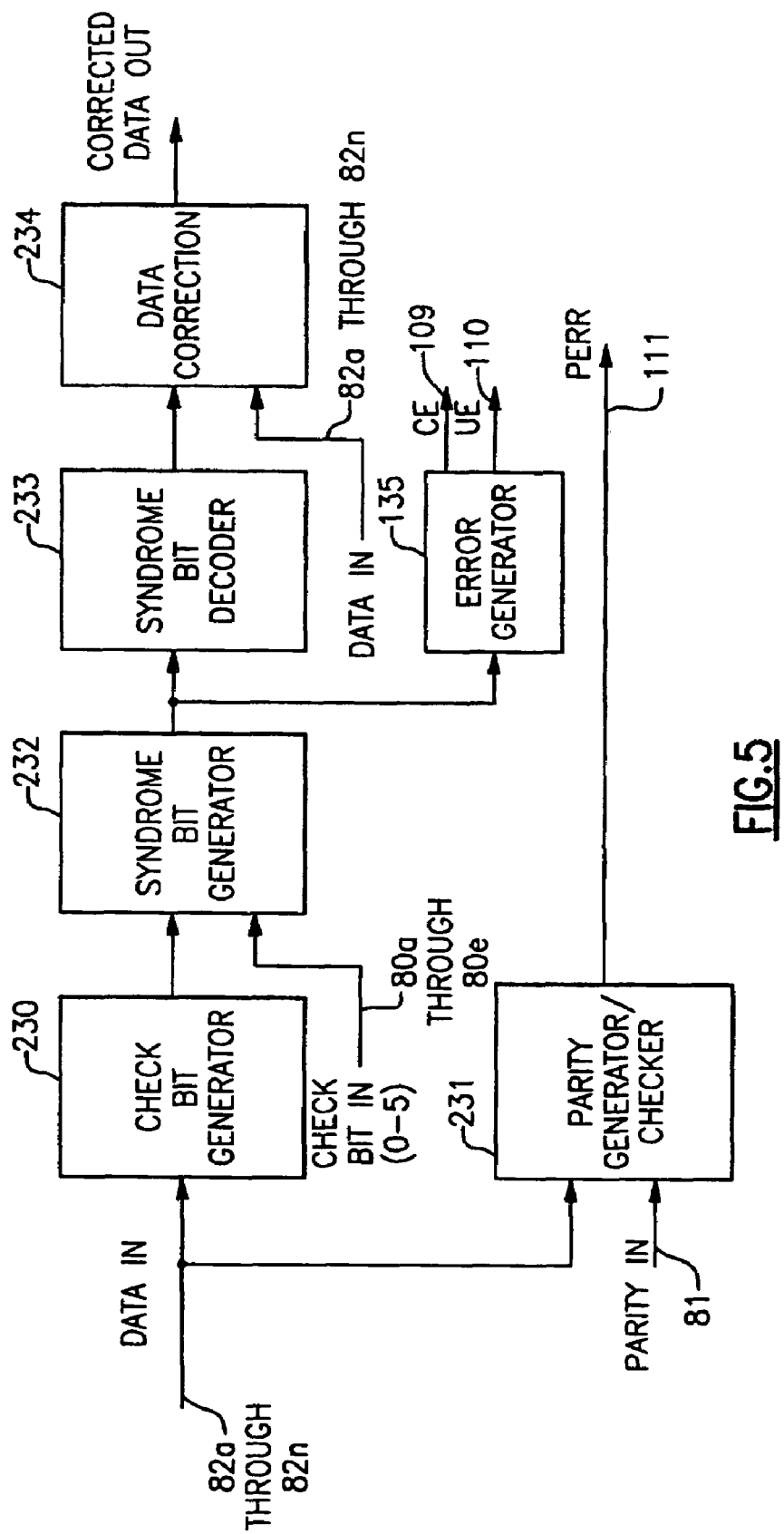
FIG. 5 is a block diagram of the single error correction/ double error detection error correction code (SEC/DED ECC) circuit of FIG. 4B.
Figure 8:
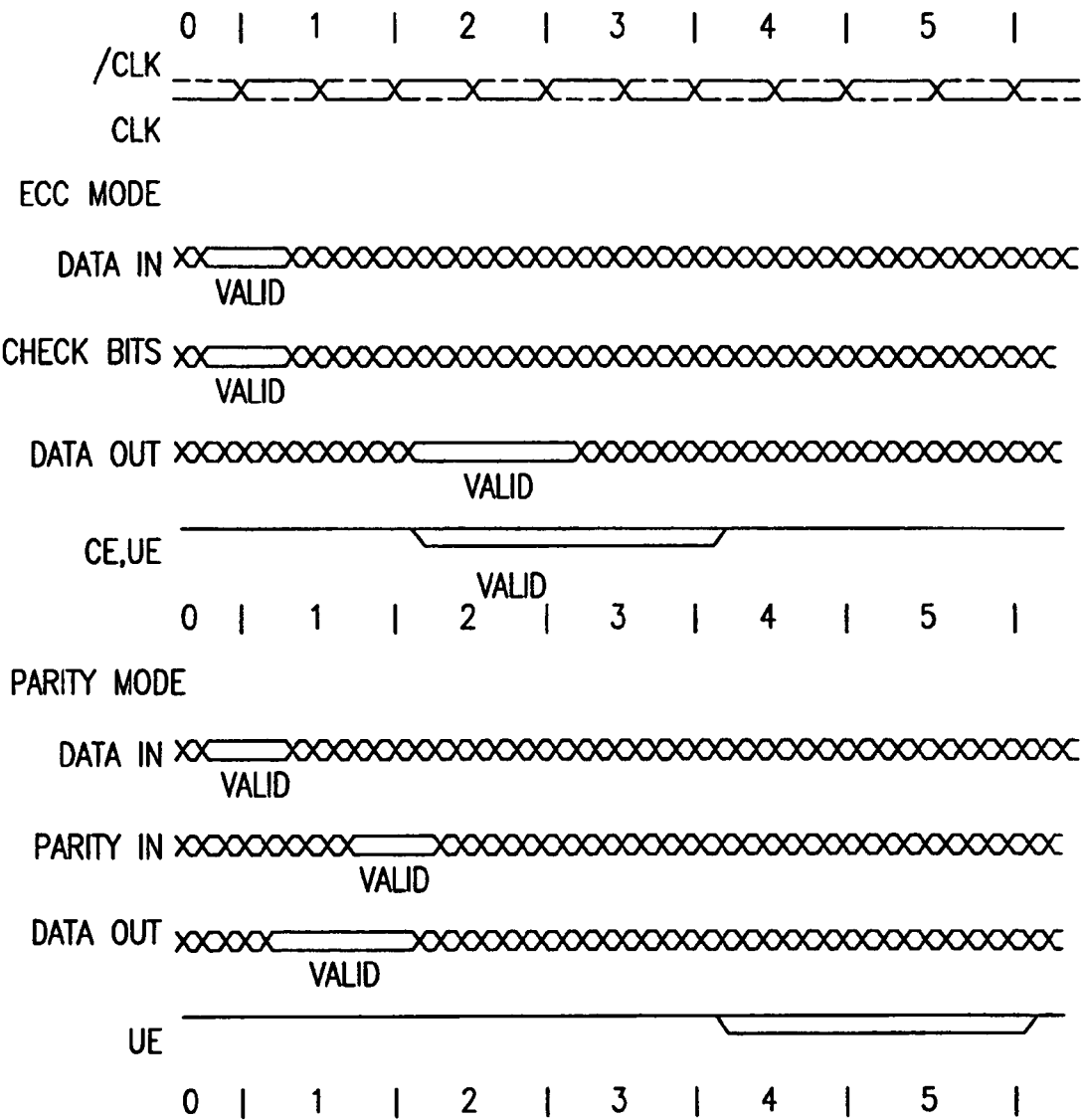
FIG. 8 shows the timing diagram used with the present invention.

A full appreciation of the features and advantages of the present invention can best be gained by reference to the drawings and more particularly to the figures where: FIG. 1 is a block diagram of a typical server memory arrangement; FIG. 2 is a block diagram of the enhanced server memory arrangement of the present invention; FIGS. 3A and 3B are plan views respectively of the front and back of the 276 contact dual inline memory module (DMM) of the present invention; FIGS. 4A and 4B are schematic views of the register, parity and error correction circuits shown in FIGS. 3A and 3B; FIG. 5 is a block diagram of the single error correction/double error detection error correction code (SEC/DED ECC) circuit of FIG. 4B; FIG. 6 describes, in H—matrix, form the preferred ECC code selected for the module of FIG. 3A; FIGS. 7A, 7B and 7C show the designated pin connections for the DIMM of FIGS. 3A and 3B and FIG. 8 shows the timing diagram used with the present invention.

In FIG. 1 there is illustrated, in schematic form, a block diagram of a typical server memory arrangement as might be found in any currently available server which can employ a plurality of dual inline memory modules (DIMMs). It should be understood that many such DIMMs would be used in actual practice but for ease of illustration only one prior art DIMM 10 is shown in FIG. 1. DIMM 10, is a printed circuit card on which there is provided a plurality of either synchronous dynamic random access memories or dynamic random access memories circuits 11, herein after collectively referred to as DRAM. Each DRAM 11 on the DIMM 10 has a plurality of output pins that are coupled, via the printed circuitry on the DIMM to the contacts on the DIMM and theses contacts are further coupled, via a data line 15, to a memory interface chip 18 and to a memory controller or processor 19. Each DRAM on the DIMM is further, coupled via such DIMM contacts, to a register 12 and to a phase locked loop circuit 14 on the DIMM. The phase locked loop 14 (PLL) is connected via clock line 17 to the memory interface chip 18. The register 12 is also coupled to the memory interface chip 18 via an address and command (cmd) bus 16. The memory interface chip 18 is coupled to the memory controller 19 via the data line 15, address and command line 16 and Clock line 17. It should be understood that although only one such DIMM is shown in this figure that in actuality the server would contain many such DIMMs. Such other DIMMs would be coupled in a like manner to the memory interface chip 18 and memory controller 19 via data, address and command lines. Since such servers and their operation are so well known to those skilled in the art, further description of such servers and their operation is not deemed necessary.

Turning now to FIGS. 2, 3A, 3B, 4A, 4B, 5 and 8 the enhanced server memory arrangement of the present invention will be described.

In FIG. 2 there is illustrated, in schematic form, a block diagram of a server memory arrangement employing the present invention. In this FIG. 2 the server comprises a novel DIMM 20 provided with a novel ECC/Parity Register chip 21 coupled to the memory interface chip 18 which is in turn coupled to the memory controller or processor 19. It should be understood that the chip 21 need not include both the ECC function and the parity function. For example, the chip 21 could have just the ECC function alone or just the parity function alone and still operate in accordance with the present invention. More specifically, as shown in this FIG. 2, the memory interface chip 18 sends and receives data from the DIMMs via the data line 15 and sends address and commands via line 16. The memory interface chip 18 then sends and receives data, via line 15, to the DRAMs and sends address and command information to the register chip 21 via add/cmd line 16 and check bits for error correction purposes to the ECC/Parity register chip 21 via line 25.

FIGS. 3A and 3B show respectively the front and back views of the novel DIMM 20 of the present invention. Generally speaking DIMMs are printed circuit cards designed to carry a plurality of DRAMs 22 thereon and the DRAM output pins (not shown) are connected via the printed circuit to selected connectors 23 along the edge of both the back and front sides of the card and are often provided with a single indexing key or notch 9 on the connector edge. The use and manufacture of such DIMMs is well known and need not be further described herein. The DIMM of the present invention however is novel and is designed to address several of the most significant contributors to unplanned and often catastrophic system outages encountered in the prior art DIMs. The improvements in the DIMM of the present invention are realized especially by enlarging the length of DIMM 20 to between 149 mm and 153 mm. Nominally the DIMM 20 is 151.35 mm (5.97 inches) long and its width is 30.48 mm (1.2 inches). The width of the DIMM is not critical and the DIMM need only be wide enough to accommodate the DRAMs installed thereon. The length of the DIMM however must be such that the DIMM 20 can accommodate additional signal contacts, up to 138, as well as up to thirty-six DRAMs 26 having a body size up to 14 mm by 21 mm and have a locating key or notch 9 a distance of between 82.675 mm from one end of the DIMM and 68.675 mm from the other end of the DIMM as shown. Again it should be understood that these dimensions are nominal and may vary plus or minus 3 mm in various implementations. The DIMM can also be provided with additional notches 9a and 9b on each side, i.e., the shorter edges of the DIMM 20. These dimensions permit the DIMM, of the invention, to accommodate placing up to eighteen DRAMs on the front surface and up to an additional eighteen such DRAMs on the rear surface. Further, as shown in FIG. 3A, on the front of each DIMM 20, in addition to the DRAMs, there is positioned a phase locked loop chip 24 and the novel ECC/Parity Register chip 21 of the present invention. This novel ECC/Parity Register chip 21 will be further described below and in detail in conjunction with FIGS. 4A and 4B It should be understood that the phase locked loop chip can be eliminated if its circuitry is provided on the register chip 21.

This new, improved, larger sized DIMM 20, shown in these FIGS. 3A and 3B, also achieves a further significant improvement in the interconnect failure rate for the larger size of the module permits the connector system to accommodate two hundred and seventy-six contacts or pins 23. These pins are numbered and coupled to respective inputs as shown in FIGS. 7a, 7b, and 7c. Contact or pin number one (1) is identified and shown in FIG. 3A as contact 23A and is on the left hand side of the front side of the DIMM 20 and is positioned approximately 5.175 mm from the left edge of the DIMM 20 and 77.5 mm from the center of the notch 9. Contact or pin number one hundred and thirty-eight (138) is identified and shown in FIG. 3A as contact 23B and is on the right hand side of the front side of the DIMM 20 and is positioned approximately 5.175 mm from the right edge of the DIMM 20 and approximately 63.5 mm from the center of the notch 9. Contact or pin number one hundred and thirty-nine (139) is identified and shown in FIG. 3B as contact 23C and is directly opposite contact number one 23A and is also positioned approximately 5.175 mm from the left edge of the DIM 20 and is also 77.5 mm from the center of the notch 9. Contact or pin number two hundred and seventy-six (276) is identified in shown in FIG. 3B as contact 23D and is directly opposite contact number one hundred and thirty-eight 23B and is also positioned approximately 5.175 mm from the right edge of the DIMM 20 and 63.5 mm from the center of the notch 9. The greater size of this DIMM 20 also accommodates the inclusion the new and a larger ECC/Parity register 21 required by the present invention. Because the two hundred and seventy-six contacts or pins 23 on this larger DIMM are more than sufficient to meet the needs of all the circuitry on the DIMM this means that the DIMM provides extra or redundant contacts. These extra or redundant contacts or pins 23 can now be used to provide additional protection for certain selected signal or voltage lines, for which error correction is not possible. The present invention by providing such redundant contacts effectively eliminates concerns such as contact failures on clock inputs, CS, CKE, and ODT inputs, Vref inputs, and other signals not protected by ECC. Other benefits include the elimination or reduction of concerns regarding power supply noise and/or voltage drops due to scarcity of voltage (VDD) contacts in the data region as well providing additional ground pins in the address/control region on the DIMM 20. The larger contact count of the present invention also permits the DIMM 20 to be wired such that they are consistent with prior art DIMMs. The additional contacts 23 also permit the inclusion of ECC check bits, associated with address and command inputs, allowing for real-time system monitoring of faults associated with these inputs, as well as system interrogation of fault counts and attributes. These faults would result in catastrophic system outages in conventional prior art systems using the smaller prior art DIMMs.

It should be understood that although only one DIMM 21 is shown in the FIGS. 1 and 2 that, in actuality, the server would contain many such DIMMs. As noted above, the DIMM 21, of the present invention, is provided with a plurality of SDRAMs 22, a phase locked loop circuit 24 and the ECC/Parity register 21. The ECC/Parity register 21 on DIMM 20 includes unique error correction code (ECC) circuitry that is coupled to the memory interface chip 18 via line 25 to provide even greater significant reliability enhancement to such servers. The inclusion of this new, improved error correction code (ECC) circuitry results in a significant reduction in interconnect failure.

FIGS. 4A and 4B together comprise a schematic view of the novel ECC/Parity register 21 on DIMM where, for clarity in description, it is shown as comprised of two distinct sections 21a and 21b. FIG. 4A shows the enhanced function 28 bit 1:2 register segment 21a of the present invention and FIG. 4B shows the error correction code circuit segment 21b. The error correction code circuit ECC segment 21b, shown in FIG. 4B, corrects for single bit errors and thus permits continuous memory operation independent of the existence of these errors. This ECC segment also includes a parity operating mode circuitry together and error reporting circuitry. The novel ECC/Parity register 21 on DIMM 20 thus provides leading-edge performance and reliability and key operational features different from and unavailable from the prior art while retaining timing requirements generally consistent with the JEDEC 14 bit 1:2 DDR II register.

More particularly, the register segment 21a contains a plurality of so called differential bit receivers 40a through, 40e, 41, 42a through 42n, 43, 44, 45a, 45b, 46a and 46b and a single amplifier 47. Each of these differential receivers 40a through 40e, 41, 42a through 42n, 43, 44, 45a, 45b, 46a and 46b has two inputs and a single output. One of the inputs of each differential receiver 40a through, 40e, 41, 42a through 42n, 43, 44, 45a, 45b, 46a and 46b is coupled to a reference voltage source 28. The second input of the each of the differential receivers 40a through, 40e, 41, 42a through 42n, 43, 44, 45a, 45b, 46a and 46b are coupled to respective inputs 30a through, 30e, 31, 32a through 32n, 33a, 33b, 34, 35a, 35b, 36a and 36b.

Receiver set 40a through 40e is comprised of five receivers of which only the first and the last receivers 40a and 40e are shown. Receivers 40a through 40e have their second inputs respectively coupled to respective check bit lines 30a through 30e and their outputs connected through respective primary multiplexers 60a through 60e to the inputs of respective primary latches 70a through 70e. Typically the check bit lines are contained in a bus that contains a set of five such check bit lines. However, for simplification of the drawing and ease of description only, FIG. 4a shows only the first and the last check bit lines 30a and 30e of the set and the first and last of the receivers 40a through 40e. It being understood that each receiver in the set 40a through 40e has one of its respective inputs coupled to a respective one of a set of check bit input lines 30a through 30e and its output to a respective one of a set of three input multiplexers and thence to a respective one of a set of three input primary latches.

The second input of the differential receiver 41 is coupled to a check bit 0/Parity_in signal line 30.

Receiver set 42a through 42n is comprised of twenty two receivers coupled to a data line bus typically containing twenty two data lines 32a through 32n. However, for simplification of the drawing and ease of description only, FIG. 4a shows only the first and the last data lines 32a and 32n of the set and the first and last of the receivers 42a through 42n are shown in the drawing. The first receiver 42a is shown as having its first input coupled to data bit line 32a and its output coupled to the first input of multiplexer 62a whose output is coupled to a first input of primary latch 72a and the last receiver 42n is shown as having its first input coupled to data bit line 32n and its output coupled to the first input of multiplexer 62n whose output is coupled to a first input of primary latch 72n. Each respective receiver in set 42a through 42n has an input coupled to a respective one of data lines in set 32a through 32n and their outputs connected through respective primary multiplexers 42a through 42n to the inputs of respective primary latches 62a through 62n. All the primary multiplexers and latches in the set 42a through 42n are identical to those shown connected to receivers 42a and 42n. Thus each receiver in the set has one of its respective inputs coupled to a respective one of a set of data bit input lines and its output to a respective one of a set of two input multiplexers and thence to a respective one of a set of primary latches. These signals are inputted from the memory interface chip 18 in FIG. 2 and are re-driven only when one or more of the inputs 33a, 33b, or 34 are low.

As previously noted, the second input of the differential receiver 41 is coupled to a check bit 0/Parity_in signal line 30. The output of the differential receiver 41 is coupled to an input of multiplexer 61 whose output is coupled to a primary latch 71. The check bit 0/Parity_in signal is interpreted as an ECC check bit from the memory controller or as a parity bit depending on the setting of ECC mode input 136 (FIG. 4B) Clock inputs 131 are fed to all the primary latches 70a through 70e, 71, 72a through 72n, 73, 74, 75a, 75b, 76a and 76b. The Check bits 1-5 at inputs 30a through 30e are in a dont care state when the register is being operated in parity mode and will be held low. When these inputs are operated in parity mode, a parity in signal will be provided on the Check bit 0/Parity_in signal line 30 and maintain odd parity across the data inputs 32a through 32n, at the rising edge of the clock signal (CK) at input 131 that immediately follows the rising edge of clock 131 that occurred simultaneously with the associated data inputs 32a through 32n.

The second inputs of the differential receivers 43 and 44 are respectively coupled to chip select lines /CS0 and /CS1 and the outputs of the differential receivers 43 and 44 are coupled respectively to the first inputs of primary latches 73 and 74 as well as to the first and second inputs of a three input select NAND gate 63. The output of NAND gate 63 is coupled to the selection input of the multiplexers 60a through 60e, 61 and 62a through 62n. These lines initiate DRAM address/command decodes and as such at least one will be low when a valid address/command signal is present and the register can be programmed to re-drive all the data inputs when at least one chip select input (CS0, /CS1) 33a, 33b is low. The third input of this NAND gate 63 is coupled to CS gate enable circuit 34 which can be set low to cause multiplexers 60a through 60e to pass signals from receivers 32a through 32n independent of the levels on inputs 33a and 33b.

The output of differential receiver 43 and 44 are also respectively coupled through the lines 172 and 174 and the AND gate 175 (FIG. 4B) whose output is coupled to the error logic circuit 100 also shown in FIG. 4b.

Receiver 45a has an input coupled to the clock enable signal source 35a (CKE0) and an output coupled to the primary latch 75a.

Receiver 45b has an input coupled to the clock enable signal sources 35b (CKE1) and an output coupled to the primary latch 75b.

Receiver 46a has an input coupled to the on die termination line signal input line 36a (ODT0) and an output coupled to the primary latch 76a.

Receiver 46b has an input coupled to the on die termination line signal line 36b (ODT1) and an output coupled to the primary latch 76b.

Receiver 47 has an input coupled to the reset (/RST) signal line 37. The inputs 35a and 35b (CKE0, CKE1) 36a and 36ba (ODT0, ODT1) are provided from the memory interface chip 18 and are not associated with the Chip Select (CS) inputs 33a and 33b, and signal from source 37 (/RST) driving amplifier 47 is an asynchronous reset input and, when low, resets all the primary latches 70a through 70e, 71, 72a through 72n, 73, 74, 75a, 75b, 76a, 76b and all the secondary latches 92a through 92n, 93, 94, 95a, 95b, 96a and 96b thereby forcing the outputs low. This signal from source 37 (/RST) also resets the error bus registers and error lines from the error logic circuit 100.

Coupled to the above described register of FIG. 4A is the unique error correction code circuit arrangement of FIG. 4B.

In FIG. 4B, module location identification is provided to error logic circuit 100 which is more fully described in conjunction with FIG. 6 below. This module location identification is provided to error logic circuit 100 through receivers 79a, 79b, and 79c whose inputs are coupled to DIMM address input range sources (SA0, SA1, SA2) 78a, 78b and 78c and whose outputs are coupled to an error logic circuit 100. The signals from sources (SA0, SA1, SA2) 78a, 78b and 78c define the DIMM address which is then reported on the error bus when requested by the system. This error logic circuit 100 is controlled by a signal from the NAND gate 175 when either of the DRAM chip select signal sources (/CS0) 33a and (/CS1) 33b are active. The error logic circuit 100 further has a reset signal source 180 coupled thereto.

Also included in the error correction code circuit of FIG. 4b is a SEC/DED ECC circuit 90 which is more fully described in conjunction with FIG. 5 below. Coupled to this SEC/DED ECC circuit are the outputs of primary latches 70a through 70e, 71 and 72a through 72n. This SEC/DED ECC circuit 90 provides three outputs 109, 110, and 111 to the error logic circuit 100. These outputs are: a correctable error (CE) line 109, an uncorrectable error (UE) line 110 and a parity error bit line 111 fed to the error logic circuit 100 which provides outputs regarding correctable and uncorrectable errors on output lines 120 and 121. When either error line (CE) 109 or uncorrectable error line (UE) 110 is low this indicates that an error was identified as being associated with the address and/or command inputs (either correctable or uncorrectable). The error lines 120,121 will be active, i.e., low, for two clock cycles simultaneous with the re-driven address/command data when operating in ECC mode or delayed by two clock cycles when operating in parity mode. The logic error circuit 100 also provides an Error Bus (Inter Integrated circuit or IIC) 122 for external collection of error information such as error type, DIMM address, error count and status of the 28 input and internally generated syndrome bits at the time of the first fail. The information remains latched until a reset command is written to bus 122 or /RST input 37 is switched low. The selected IIC protocol allows unique byte addressing of the nine registers, consistent with the present industry standard protocol for serial program decode electronic erasable programmable read only memory (SPD EEPROM) and is well known to the art.

This SEC/DED ECC circuit 90 also has data bit outputs coupled through secondary latches 92a through 92n to a first input of all the output or secondary multiplexers 102a through 102n. The output of register latches 72a through 72n labeled BYPASS are directly connected to the second input of the output or secondary multiplexers 102a through 102n thereby allowing the SEC/DED ECC circuit 90 to be bypassed depending on the ECC mode input 123.

The output of the primary or register latches 73, 74, 75a, 75b, 76a and 76b are all coupled to a first input of secondary or output latches 93, 94, 95a, 95b, 96a and 96b and through these secondary latches 93, 94, 95a, 95b, 96a and 96b to a first input of output or secondary multiplexers 103, 104, 105a, 105b, 106a and 106b. The outputs of primary latches 73, 74, 75a, 75b, 76a and 76b are connected directly to a second input of output or secondary multiplexers 103, 104, 105a, 105b, 106a and 106b thereby allowing secondary latches 93, 94, 95a, 95b, 96a and 96b to be bypassed based on the /Delay CKE input 124 and /ECC mode input 123.

A control circuit comprised of a differential register 130 that has a first input coupled to a CK signal input 131, a second input coupled to a /CK signal input 132 and its output coupled to a second input all the primary latches 70a through 70e, 71, 72a through 72n, 73, 74, 75a, 75b, 76a and to the second input of all the output or secondary latches 92a through 92n, 93, 94, 95a, 95b, 96a and 96b and to the error logic circuit 100 via line 88. The /ECC mode signal source 135 is coupled to a selection third input of secondary multiplexers 102a through 102n, 103 and 104 and to the error logic circuit 100. The output or secondary multiplexers 105a, 105b, 106a and 106b have their selection inputs coupled to a source 124 of /Delay, CKE_ODT signals.

The ECC code selected for this module is a single error correction/double error detection (SEC/DED) code and is shown in the H-Matrix depicted in FIG. 6. The use of this SEC/DED code ensures that all single errors associated with the address and control bits are detected and corrected and that all double bit errors are detected. It should be noted that interconnect failures almost exclusively begin as single point fails, with other failures possibly occurring over time dependent or independent of the root cause of the initial fail.

In summary the present invention describes unique DIMM having an enhanced 28 bit 1:2 register with added error correction code logic (ECC) incorporated therein for correcting single bit errors while permitting continuous memory operation independent of the existence of these errors. A parity operating mode is also provided, in conjunction with error reporting circuitry to permit the system to interrogate the device to determine the error condition.

The above described 28 bit 1:2 register of the present invention provides key operational features, which differ from existing register designs intended for memory module applications and includes: Error detection and correction on key inputs; programmable delay for un-gated inputs; parity mode; reset circuitry; error reporting and identification and reporting of the DIMM address.

CS gating of key inputs, e.g., /CS0 and /CS1, is provided as a means of reducing device power for the internal latches which will only be updated when one or both of the chip select CS) inputs are active low (and chip select gate enable tied high) at the rising edge of the system clock. The twenty two chip select-gated signals associated with this function include addresses continuously re-driven at the rising edge of every clock depending on the state of chip select. However, the chip select gating function can be disabled by tying the chip select gate enable input low thereby enabling all internal latches to be updated on every rising edge of clock.

Programmable delay for un-gated inputs (/Delay CKE-ODT) associated with CKE and ODT (DRAM signals), the inputs will be latched and re-driven on each rising edge of the clock signal (CLK,) independent of the state of the chip select (CS) signals. However, since some controllers may be designed with limited flexibility regarding latency for these signals vs chip select (CS), address (Addr), row address strobe (RAS), column address strobe (CAS) and write enable (WE), a delay block can be selected to re-align the timing relationships which are offset by 1 clock when the error correction code circuitry (ECC) is enabled.

ECC Mode (/ECC Mode low): For all inputs gated by CS, on-chip SEC/DED ECC logic is enabled and the signal received on CHK0/Parity in is received as check bit 0 when /ECC Mode input is low. This ECC logic will operate across 28 inputs (22 'CS-gated inputs and the 6 check bits) and will correct all single bit errors and detect all double bit errors present on the twenty two chip select gated data inputs. If a correctable error is detected, /Error (CE) will be driven low for two clocks and errors will be counted and latched in the error bus registers for the 28 inputs if this is the first error since a reset is issued. Any double bit error will also be detected (as well as many other errors that are not correctable), and will be reported on the /Error (UE) error line (driven low for two clocks) and in the error bus registers if this error is the first since a Reset is issued. Although CS0-1 are not included in the ECC logic, the propagation delay of the CS output signals will track the signals included in the ECC logic (1 additional clock of latency)

In addition to the above ECC mode, the same twenty two chip select gated data signals can be operated in 'parity mode (/ECC Mode high), whereby the signal received on CHK0/Parity in line is received as parity to the register one clock pulse later than the chip select gated data inputs. The received parity bit is then compared to the parity calculated across these same inputs by the register parity logic to verify that the information has not been corrupted. The twenty two chip select gated data signals will be latched and re-driven on the first clock pulse and any error will be reported two clock pulses later via the uncorrectable /Error (UE) line (driven low for two clock pulses) and in the Error Bus Registers. No correction of errors will be completed in this mode. The convention of parity, in this application, is odd parity (odd numbers of 1s across data and parity inputs equals valid parity).

The /RST signal input is used to clear all internal latches (including the error registers), and all outputs will be driven low quickly except the error lines which will be driven high.

Error reporting circuitry is included to permit external monitoring of DIMM operation. Two open-drain outputs are available to permit multiple modules to share a common signal line for reporting an error that occurred during a valid command (/CS=low) cycle (consistent with the re-driven signals). These two outputs are driven low for two clocks to allow the memory controller time to sense the error./Error (CE) indicates that a correctable error occurred and was corrected by the ECC logic, /Error (UE) indicates that an uncorrectable error occurred and depending on the mode selected is an uncorrectable ECC error or a parity error. Note that the timing of /Error (UE) is different in parity mode vs ECC mode.

In addition, an error bus (9 registers that can be read and reset via an IIC bus) is available to permit the device to be interrogated for additional error information, such as the error type (correctable, uncorrectable or parity error), error count and the memory card location (via the SA0-2 address pins which are conventionally wired only to the separate serial program decode (SPD) electronic erasable programmable read only memory (EE PROM). Other information is also available for diagnostics such as the signals received by the register (address/command, control signals, check bits, parity bit) when a chip select (CS) is active low and the associated syndrome bits so that they can be decoded to determine which of the 28 input signals (22 CS-gated plus 6 check bits) or internal ECC logic failed. These registers will contain information about the first fail, and the error counter will continue to increment until it is reset or reaches the full count (64K). All registers can be reset by writing the reset error bus command on the IIC bus, or via the /RST pin.

In addition to the use of the ECC structure defined above (included in both the memory interface chip and the register on the DIMM), redundant contacts are included on the module pinout to effectively eliminate other possible SPOF (single-point-of-failure) contributors in the interconnect system. Contacts that cannot be protected by the ECC structure described above, for various reasons, include the following: voltage reference (Vref), Clocks, Chip Selects (CS), CKEs, ODTs, VSS/VDD contacts or pins, Error lines, data input on the IIC bus (SDA), data clock on the IIC bus (SCL) and related signals. In the present invention each of these contacts is provided with a first contact on a first side of the DIMM and a redundant contact directly opposite the first contact on the opposite side of the DIMM. For example if the voltage reference source 28 is applied via contact or pin 1 on the front side of the DIMM it is also applied via contact or pin 139 on the back side of the DIMM with contact 1 being direct opposite contact 139. Similarly the SDA signal is applied via contact or pin 135 on the front side of the DIMM and also via the contact or pin 273 on the back side of the DIMM and the SCL signal is applied via contact or pin 136 on the front side of the DIMM and also via contact or pin 274 on the back side of the DIMM. A full description of the contact or pin assignment matrix for the present invention is shown in FIGS. 7A, 7B and 7C. The specific contact placement is selected to maximize fault tolerance. By providing such opposite redundant contacts, problems caused, for example, by a slight bowing of the DIMM will cause low contact pressure on a contact on one side of DIMM but high pressure on the opposing contact. In such cases good signal flow will always be assured when such redundant and opposing contacts, as discussed above, are used. These opposing and redundant contacts will also facilitate board wiring by minimizing wiring congestion for this solution also permits in-line wiring. The following chart is a listing of the DIMM locations of a few of these contacts.

| SIGNAL | CONTACT or PIN# | SIDE of DIMM | NOMINAL DISTANCE FROM KEY | DIRECTION FROM KEY |
| --- | --- | --- | --- | --- |
| CS0 | 86 | FRONT | 11.495 mm | RIGHT |
| CS0 | 224 | BACK | 11.495 mm | LEFT |
| CS1 | 91 | FRONT | 16.495 mm | RIGHT |
| CS1 | 229 | BACK | 16.495 mm | LEFT |
| CKE0 | 65 | FRONT | 13.505 mm | LEFT |
| CKE0 | 203 | BACK | 13.505 mm | RIGHT |
| CKE1 | 62 | FRONT | 16.505 mm | LEFT |
| CKE1 | 200 | BACK | 16.505 mm | RIGHT |
| RAS | 222 | BACK | 9.495 mm | LEFT |
| CAS | 87 | FRONT | 12.495 mm | RIGHT |
| WE | 84 | FRONT | 9.495 mm | RIGHT |
| CK0 | 77 | FRONT | 2.495 mm | RIGHT |
| CK0 | 215 | BACK | 2.495 mm | LEFT |
| CK0B | 78 | FRONT | 3.495 mm | RIGHT |
| CK0B | 216 | BACK | 3.495 mm | LEFT |

The ECC function adds a single clock pulse delay (at planned operating frequencies) to the DIMM register performance, which may be of concern to some performance-optimized applications. As such, two additional modes are included on the module that permit the system user to tradeoff performance and reliability. In Parity Mode, the memory interface chip or controller would generate a single parity bit in conjunction with providing the full address and command field to the module. The module would re-drive the address and command bits, to the DRAMs, in the next cycle—rather than adding the additional cycle required in ECC mode. Any error on the address and command bus would be reported to the system at a later time, and the potential for recovery from the fail would be small hence this option is undesirable for many applications. The last mode would be to simply operate the memory in a mode with no parity bits and no ECC bits, with neither the added delay due to ECC nor any means to detect a fault on the address/command bus as per the prior art convention now used for these modules.

FIG. 5 is a block diagram of the SEC/DED ECC circuit of FIG. 4B. The twenty two data inputs 32a through 32n via the twenty two latches 72a through 72n and lines 82a through 82n are fed both to a check bit generator circuit 230 and a first input of a parity generator/checker circuit 231. The parity generator/checker circuit 231 further has a second input coupled to the parity in signal source 31 via primary latch 71 and output line 81 and depending on the state of the parity input signal on input 31 sends a parity error signal (PERR) on output line 111 to the error logic circuit 100.

Meanwhile the check bit generator circuit 230 is transferring the twenty two inputted data signals to a first input of a syndrome bit generator 232 whose second input is coupled to the check bit inputs 30a through 30e through the lines 80a through 80e coming from the primary latches 70a through 70e.

The Syndrome bit generator 232 then transfers the twenty two data signals to a first input of a syndrome bit decoder and the six check bits to the error generator 235 which determines if there are either correctable or uncorrectable errors in the received data and provides the appropriate correctable error or uncorrectable error signal to the error logic circuit 100 via either line 109 or 110. The syndrome bit decoder now decodes the twenty two data bits and transfers them to the data correction circuit 234. In the correction circuit the syndrome bits are selectively X ored with the data inputs consistent with the H-matrix, shown in FIG. 6, with any single bit errors in the data field inverted to correct the error.

The Error Logic block 100 consists of 3 major elements (not shown) which are an error counter, a status register block that contains a plurality of status registers, and an IIC logic block all of which are interconnected through common logic circuits. All of these blocks as well as the interconnecting logic circuits are common and readily available circuits known to those skilled in the art.

More specifically, the error counter is a 16-bit counter that increments as it receives errors inputs (CE, UE or Parity) from the SEC/DED ECC 90. This error counter continues to count errors (until it reaches its full count) even while the status registers are being read out on the IIC bus.

The status register block includes, in the present case, nine eight bit register sets (0-8) which contain information on the data input (DO-21) signals, the check bit signals (CO-5 and Parity In) signals received from the memory controller 19 as well as signals from the memory module 20 (FCC/Parity Mode, SAO-2), the error count, and the syndrome bits (S0-5) which are calculated by the SEC/DED ECC 90.

The IIC Logic block consists of the necessary logic to support the ""IIC Bus Specifications Version 2.1 January 2000 Standard". In this case the register is an IIC slave where the register is addressed by the DIMM address input range sources (SA0, SA1, SA2) 78a, 78b and 78c and responds to several IIC bus commands—reset, read from the nine (9) Status Registers and the test mode.

The miscellaneous logic circuits interconnecting the above described error counter, status register block and IIC logic block include logic circuits designed to reset the error counters and the nine (9) status registers from either the external reset signal (/RST) source 37 or an internal power-on reset, to load the contents of the nine status registers and logic (including a set of shadow registers) that the IIC logic will send out onto the IIC bus when a IIC bus read occurs, along with some control logic to drive the correctable error (CE) and uncorrectable error (UE) lines out if such an error occurs.

The error bus that comprises nine (9) registers that can be read and reset via an IIC bus) permits the device to be interrogated for additional error information, such as the error type (correctable, uncorrectable or parity error), error count and the memory card location (via the SA0-2 address pins, also shared by the separate SPD EPROM). Other information is also available for diagnostics such as the signals received by the register (address/command, control signals, check bits, parity bit) associated with a CS is active low and the syndrome bits so that they can be decoded to determine, in the case of a failure, which of the 28 input signals (22 'CS-gated plus 6 check bits) failed. These registers will contain information about the first fail, and the error counter will continue to increment until it is reset or reaches the full count (64K). All registers can be reset by writing the Reset Error Bus command on the IIC bus.

The Byte 0: Status Register is the general status bit register that can be read to determine the type of error, the mode and the address of the DIMM (same as the DIMM SPD address).

| Byte 0: Status Register | | | | | | | |
|---|---|---|---|---|---|---|---|
| Bit 7 | Bit 6 | Bit 5 | Bit 4 | Bit 3 | Bit 2 | Bit 1 | Bit 0 |
| RFU0 | DIMM Address SA2 | DIMM Address SA1 | DIMM Address SA0 | Mode 1 = ECC 0 = Pty | Parity Error 1 = PERR | ECC error 1 = UE | ECCerror 1 = CE |

Bytes 1 and 2: Error Counter

The 16 bit error counter will count up to 64K errors (FFFF hex) based on any error (CE, UE or Parity Error). Byte 1 is the LSB and byte 2 is the MSB of the error counter. Once the 16-bit counter has counted up to all ones, it will stay all 1s until the error bus is reset. The error counter register will not increment during a IIC read operation but will continue to count errors if they occur.

| Bit 7 | Bit 6 | Bit 5 | Bit 4 | Bit 3 | Bit 2 | Bit 1 | Bit 0 |
|---|---|---|---|---|---|---|---|
| | | | Byte 1 (LSB) | | | | |
| E7 | E6 | E5 | E4 | E3 | E2 | E1 | E0 |
| | | | Byte 2 (MSB) | | | | |
| E15 | E14 | E13 | E12 | E11 | E10 | E9 | E8 |

Bytes 3-7: Data Registers

Bytes 3-7 show the polarity of all 28 signals of the addresses and commands plus the check bits and parity bit that were received at the time of the first fail.

| Bit 7 | Bit 6 | Bit 5 | Bit 4 | Bit 3 | Bit 2 | Bit 1 | Bit 0 |
|---|---|---|---|---|---|---|---|
| | | | Byte 3: Data Register A (DO-7) | | | | |
| D7 | D6 | D5 | D4 | D3 | D2 | D1 | D0 |
| | | | Byte 4: Data Register B (D8-15) | | | | |
| D15 | D14 | D13 | D12 | D11 | D10 | D9 | D8 |

-continued

| Bit 7 | Bit 6 | Bit 5 | Bit 4 | Bit 3 | Bit 2 | Bit 1 | Bit 0 |
|---|---|---|---|---|---|---|---|
| Byte 5: Data Register C (D16-21, CS0-1) | | | | | | | |
| CS1 | CS0 | D21 | D20 | D19 | D18 | D17 | D16 |
| Byte 6: Data Register D (CKE0-1, ODT0-1) | | | | | | | |
| RFU0 | RFU0 | RFU0 | RFU0 | ODT1 | ODT0 | CKE1 | CKE0 |
| Byte 7: Check Bit (C0-5) and Parity Register | | | | | | | |
| RFU0 | RFU0 | Check Bit 5 | Check Bit 4 | Check Bit 3 | Check Bit 2 | Check Bit 1 | Check Bit 0/Pty In |

Byte 8: Syndrome Register

Byte 8 shows the syndrome bits associated with the first error. These can be decoded to determine which of the 22 'CS-gated signals or 6 Check Bits caused the fail. Bytes 3-7 show the polarity of all input signals at the time of the fail.

FIG. 8 shows the timing diagram used with the present invention.

| Byte 8: Syndrome Bit (0-5) Register | | | | | | | |
|---|---|---|---|---|---|---|---|
| Bit 7 | Bit 6 | Bit 5 | Bit 4 | Bit 3 | Bit 2 | Bit 1 | Bit 0 |
| RFU0 | RFU0 | Syndrome Bit 5 | Syndrome Bit 4 | Syndrome Bit 3 | Syndrome Bit 2 | Syndrome Bit 1 | Syndrome Bit 0 |

All the information necessary for one skilled in the art to design this error logic block 100 is included in the H-Matrix shown in FIG. 6 where D0 through D21 indicate refer to the data bits, C0 through C5 refer to the check bits and S0 through S5 refer to the syndrome bits.

In order to detect if the module installed in the server can properly monitor the address and control bus integrity, correct errors on the address and control bus, report errors and log and counts errors it is necessary that the DIMM error bus be functional and correctly accessed using the industry IIC protocol and the SA 0-1 bits such that the DIMM can provide a byte of data which includes Byte 0 discussed above. This is achieved by echoing back the SA 0-2 bits on bits 4, 5, and 6 of the Byte 0 and having bit 3 (the ECC flag bit) at a "1" or high level. This proves a unique signature. If the match does not occur the module is incapable of monitoring the address and control bus integrity, correcting errors on the address and control bus, reporting errors or logging and counting detected errors Parity error reporting in the present invention is realized by delivering the parity signal one cycle after the address and command to which it applies, and driving the error line low, i.e., "0" two clock cycles after the address and command bits are driven to the DRAMs from the memory interface chip if an error is detected. After holding the error line low for only 2 clock cycles, the driver will be disabled and the output permitted to return to an un-driven state (high impedance) allowing this line to be shared by multiple modules.

The invention also provides a means for and a method for adjusting the propagation delay for signals on the memory module that are not included in the ECC circuitry such that the signals can be selectively re-driven within one or two clock cycles. This results in a significant increase in module operating speed.

Moreover by operating the memory module in parity mode, unused ECC check bit inputs can be held at a low level, i.e., "0" thus ensuring that these inputs are at a known and quiescent state.

Finally the module of the invention may be operated as if it were a conventional non-ECC protected module, by effective removing the secondary registers (post-ECC) from the delay path by setting the /ECC Mode control pin to a high level, i.e. "1".

In summary, the present invention is an enhanced function 28 bit 1:2 register, intended for use on main memory modules. The register, of the present invention, adds ECC logic to correct single bit errors and permit continuous memory operation independent of the existence of these errors. A parity operating mode is also provided, in connection with error reporting circuitry to permit the system to interrogate the device to determine the error condition.

The present invention also provides CS gating of key inputs (/CS0, CS1, CS Gate Enable). As a means to reduce device power, the register's internal latches will only be updated when one or both of the CS inputs are active low (and CS Gate Enable tied high) at the rising edge of clock. The 22 'CS-gated signals associated with this function include addresses (addr 0:15, BA 0:2). RAS, CAS, WE—with the remaining signals (CS, CIE, ODT) continuously re-driven at the rising edge of every clock as they are independent of CS. The CS gating function can be disabled by tying CS Gate Enable low enabling all internal latches to be updated on every rising edge of clock.

Programmable delay for un-gated inputs (/Delay CKE-ODT) is also provided. For the pins associated with CKE and ODT (DRAM signals), the inputs will be latched and re-driven on each rising edge of CLK, independent of the state of the chip select (CS). However, since some controllers may be designed with limited flexibility regarding latency for these signals vs CS, Addr, RAS, CAS and WE.

a delay block can be selected to re-align the timing relationships which are offset by one clock cycle when the error correction code is enabled.

Also for all inputs gated by CS, the on-chip SEC/DED ECC logic is enabled and the signal received on CHK0/Parity In is received as check bit 0 via a programming pin (/ECC Mode low). This ECC logic will operate across 28 inputs (22 CS-gated inputs and the 6 check bits), and will correct all single bit errors present on the 22 CS-gated inputs. /Error (CE) will be driven low for two clocks and errors will be counted and latched in the Error Bus Registers for the 28 inputs. Any double bit error will also be detected (as well as any error that is not correctable), and will be reported on the /Error (UE) error line (driven low for two clocks) and in the Error Bus Registers. Although CS0-1 are not included in the ECC logic, the propagation delay of the CS output signals will track the signals included in the ECC logic (1 additional clock of latency).

In addition to the above ECC mode, the same 22 CS-gated signals can be operated in 'parity mode (/ECC Mode high), whereby the signal received on CHK0/Parity In is received as parity to the register 1 clock later than the 'CS-gated inputs. The received parity bit is then compared to the parity calculated across these same inputs by the register parity logic to verify that the information has not been corrupted. The 22 'CS-gated signals will be latched and re-driven on the first clock and any error will be reported two clocks later via the /Error (UE) line (driven low for two clocks) and in the Error Bus Registers. No correction of errors will be completed in this mode. The convention of parity is odd parity (odd numbers of 1's across data and parity inputs equals valid parity).

The /RST pin is used to clear all internal latches (including the error registers), and all outputs will be driven low quickly except the error lines which will be driven high.

The error reporting circuitry, of the present invention is included to permit external monitoring of device operation. Two open-drain outputs are available to permit multiple modules to share a common signal pin for reporting an error that occurred during a valid command (/CS=low) cycle (consistent with the re-driven signals). These two outputs are driven low for two clocks to allow the memory controller time to sense the error. /Error (CE) indicates that a correctable error occurred and was corrected by the ECC logic. /Error (UE) indicates that an uncorrectable error occurred and depending on the mode selected is an uncorrectable ECC error or a parity error. Note that the timing of UE is different in parity mode vs ECC mode.

In addition, the error bus, (the nine registers discussed above that can be read and reset via an IIC bus) is available to permit the device to be interrogated for additional error information, such as the error type (correctable, uncorrectable or parity error), error count and the memory card location (via the SA0-2 address pins, also shared by the separate SPD EPROM). Other information is also available for diagnostics such as the signals received by the register (address/command, control signals, check bits, parity bit) when a CS is active low and the syndrome bits so that they can be decoded to determine which of the 28 input signals (22 ~CS-gated plus 6 check bits) failed. These registers will contain information about the first fail, and the error counter will continue to increment until it is reset or reaches the full count (64K). All registers can be reset by writing the Reset Error Bus command on the IIC bus.

This completes the description of the preferred embodiment of the invention. Since changes may be made in the above construction without departing from the scope of the invention described herein, it is intended that all the matter contained in the above description or shown in the accompanying drawings shall be interpreted in an illustrative and not in a limiting sense. Thus other alternatives and modifications will now become apparent to those sldlled in the art without departing from the spirit and scope of the invention as set forth in the following claims.

What is claimed is:

1. A high-reliability memory arrangement with a fault tolerant address and command bus for use as a main memory that will achieve the degree of fault-tolerance and self-healing necessary for autonomic computing systems comprising;
   a memory interface chip;
   a memory controller; and
   a dual inline memory module having a register coupled to the memory interface chip and the memory controller via address/command lines together with check bits for error correction such that the memory controller sends address and command information to the register via the address/command lines together with check bits for error correction purposes to the register.

2. The memory of claim 1 wherein said register is an ECC register.

3. The memory of claim 1 wherein said register is a parity register.

4. A high-reliability memory arrangement with a fault tolerant address bus and command bus for use as a main memory that will achieve the degree of fault-tolerance and self-healing necessary for autonomic computing systems comprising:
   a memory controller for sourcing address, command, and data;
   a memory module including one or more memory devices; and
   a memory re-drive device located on the memory module for communicating with the one or more memory devices and for receiving one or more of address, command and control inputs, the re-drive device comprising:
      one or more operating modes to identify faults on one or more of the address and command inputs received by the re-drive device;
      programmable input-to-output delay for one or more of the address, command and control inputs re-driven by the re-drive device;
      one or more internal latches for the temporary storage of one or more of the address, command and control inputs and error information determined by the re-drive device; and
      reset circuitry which resets at least a subset of the internal latches to a pre-defined state upon detection that a reset was issued to the memory module.

5. The memory arrangement of claim 4 wherein said re-drive device is a 28 bit 1:2 register containing error correction code circuitry (ECC) to correct for single bit errors on one or more of the command bus and the address bus, and permit continuous memory operation independent of the existence of these errors.

6. The memory arrangement of claim 4 wherein said re-drive device is a 1:2 register containing parity circuitry to identify faults on one or more of the command bus and the address bus.

7. The memory arrangement of claim 4 where said re-drive device further includes means for parity checkdng 22 data bit lines, error latches and an error reporting mode whereby a system may interrogate the re-drive device to determine the error condition thereby allowing accurate fault determination and preventive maintenance thereby reducing unplanned system outages.

8. The memory arrangement of claim of 4 wherein there is provided means for transmitting address and command data between the memory controller and the DRAMs on said memory modules via the re-drive device, the memory controller including memory interface circuitry for sending address and command information to the register via an interface which also includes one or more of parity and check bits for error correction purposes.

9. A high-reliability memory arrangement with a fault tolerant address and command bus for use as a main memory that will achieve the degree of fault-tolerance and self-healing necessary for autonomic computing systems comprising:
   a memory controller which sources addresses, commands, and data; and
   a dual inline memory module comprising:
      one or more memory devices;
         clock re-drive circuitry;
      non-volatile storage means; and
      a re-drive device, said re-drive device comprising:
         circuitry to receive and re-drive one or more of address, command, and control input received by the memory module;
         one or more internal latches for the temporary storage of one or more of the inputs and error information determined by the re-drive device; and
         reset circuitry which resets at least a subset of the internal latches to a pre-defined state upon detection that a reset was issued to the memory module.

10. The memory arrangement of claim 9, wherein the re-drive device further comprises one or more operating modes to identify faults on one or more of the address and command inputs received by the re-drive device.

11. The memory arrangement of claim 9, wherein the re-drive device includes error reporting circuitry.

12. The memory arrangement of claim 9, wherein the re-drive device includes an integrated phase locked loop.

13. The memory arrangement of claim 9, wherein the re-drive device further comprises at least two operating modes, said modes including at least one of an ECC mode, a parity mode and a mode in which neither ECC nor parity checking is performed.

14. The memory arrangement of claim 9 wherein one or more of the address, control and command information re-driven by the re-drive device has first been passed through fault-tolerant circuitry located within the re-drive device.

15. The memory arrangement of claim 9 wherein the re-drive device includes CS-gating to reduce power by enabling re-drive of at least a portion of the inputs when at least one chip select is active.

16. The memory arrangement of claim 9 wherein the re-drive device includes one or more status registers which can be read and reset.

17. The memory arrangement of claim 16 wherein the status registers include one or more of an address input, a command input, a control input, a parity input, a check bit input, an error count, a syndrome bit, an error type and a memory module address.

18. The memory arrangement of claim 9 wherein the re-drive device includes programmable input-to-output delay operable on one or more of the address, control and command inputs acted upon by the device.

19. The memory arrangement of claim 18, wherein the programmable input-to-output delay of the re-drive device consists of delaying at least a portion of the inputs by one or more clocks.

* * * * *